(12) United States Patent
Hiyoshi

(10) Patent No.: US 11,227,947 B2
(45) Date of Patent: Jan. 18, 2022

(54) INSULATED-GATE TRANSISTOR

(71) Applicant: Sumitomo Electric Industries, Ltd., Osaka (JP)

(72) Inventor: Toru Hiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/764,006

(22) PCT Filed: Oct. 3, 2018

(86) PCT No.: PCT/JP2018/036982
§ 371 (c)(1),
(2) Date: May 14, 2020

(87) PCT Pub. No.: WO2019/106948
PCT Pub. Date: Jun. 6, 2019

(65) Prior Publication Data
US 2020/0335622 A1 Oct. 22, 2020

(30) Foreign Application Priority Data
Nov. 30, 2017 (JP) .............................. JP2017-230807

(51) Int. Cl.
*H01L 29/78* (2006.01)
*H01L 29/16* (2006.01)
(52) U.S. Cl.
CPC ...... *H01L 29/7815* (2013.01); *H01L 29/1608* (2013.01); *H01L 29/7813* (2013.01)

(58) Field of Classification Search
CPC ............ H01L 29/7815; H01L 29/1608; H01L 29/42356; H01L 29/4236; H01L 29/66734;
(Continued)

(56) References Cited

U.S. PATENT DOCUMENTS 6,180,966 B1 1/2001 Kohno et al.
2006/0215341 A1 9/2006 Sakurai et al.
(Continued)

FOREIGN PATENT DOCUMENTS

JP H10-326897 A 12/1998
JP 2006-271098 A 10/2006
(Continued)

*Primary Examiner* — Eric A. Ward
(74) *Attorney, Agent, or Firm* — Baker Botts L.L.P.; Michael A. Sartori

(57) ABSTRACT

The sense region is spaced from the active region. The isolation trench surrounds the sense region and isolates the sense region from the active region. The active region is provided with a first gate trench defined by a first side surface and a first bottom surface continuing to the first side surface. The first insulating film is in contact with both the first side surface and the first bottom surface. The first conductor is provided on the first insulating film. The second insulating film is provided in the isolation trench. The second conductor is provided on the second insulating film. The isolation trench reaches a first impurity region. The first insulating film is made of a material identical to that of the second insulating film. The first conductor is made of a material identical to that of the second conductor and is electrically isolated from the second conductor.

7 Claims, 9 Drawing Sheets

(58) Field of Classification Search
CPC .......................... H01L 29/66674–66734; H01L 29/7803–7808; H01L 29/7802–7826; H01L 29/7813
See application file for complete search history.

(56) References Cited

U.S. PATENT DOCUMENTS

| | | | |
|---|---|---|---|
| 2009/0250770 A1* | 10/2009 | Su | H01L 29/66734 257/401 |
| 2010/0207206 A1* | 8/2010 | Krischke | H01L 29/7813 257/337 |
| 2014/0319540 A1 | 10/2014 | Sugimoto | |
| 2015/0333127 A1 | 11/2015 | Morino et al. | |
| 2016/0087094 A1 | 3/2016 | Takaya et al. | |

FOREIGN PATENT DOCUMENTS

| | | |
|---|---|---|
| JP | 2014-150126 A | 8/2014 |
| JP | 2014-216465 A | 11/2014 |
| JP | 2016-063107 A | 4/2016 |

* cited by examiner

FIG.1

INSULATED-GATE TRANSISTOR

TECHNICAL FIELD

The present disclosure relates to an insulated-gate transistor. The present application claims priority to Japanese Patent Application No. 2017-230807 filed on Nov. 30, 2017, the entire contents of which are incorporated herein by reference.

BACKGROUND ART

Japanese Patent Laying-Open No. 2014-150126 (PTL 1) discloses a metal oxide semiconductor field effect transistor (MOSFET) including a main cell region and a sense cell region. An element isolation layer is formed between the main cell region and the sense cell region.

CITATION LIST

Patent Literature

PTL 1: Japanese Patent Laying-Open No. 2014-150126

SUMMARY OF INVENTION

An insulated-gate transistor according to the present disclosure includes an active region, a sense region, an isolation trench, a first insulating film, a first conductor, a second insulating film, and a second conductor. The sense region is spaced from the active region. The isolation trench surrounds the sense region and isolates the sense region from the active region. The active region includes a first impurity region having a first conductivity type, a second impurity region provided on the first impurity region and having a second conductivity type different from the first conductivity type, and a third impurity region provided on the second impurity region so as to be separated from the first impurity region and having the first conductivity type. The active region is provided with a first gate trench defined by a first side surface and a first bottom surface continuing to the first side surface. The first side surface is formed by the first impurity region, the second impurity region and the third impurity region. The first bottom surface is formed by the first impurity region. The first insulating film is in contact with both the first side surface and the first bottom surface. The first conductor is provided on the first insulating film. The second insulating film is provided in the isolation trench. The second conductor is provided on the second insulating film. The isolation trench reaches the first impurity region. The first insulating film is made of a material identical to that of the second insulating film. The first conductor is made of a material identical to that of the second conductor and is electrically isolated from the second conductor.

BRIEF DESCRIPTION OF DRAWINGS

FIG. 1 is a schematic cross-sectional view showing the configuration of an insulated-gate transistor according to a first embodiment, and corresponds to a schematic cross-sectional view taken along line I-I in a direction of arrows in FIG. 3.

DETAILED DESCRIPTION

Figure 2:
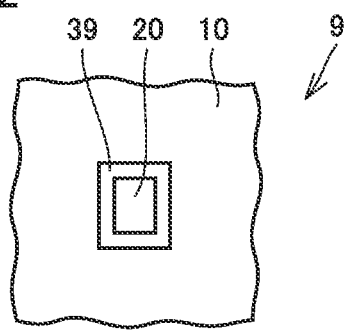
FIG. 2 is a schematic plan view showing the configuration of a silicon carbide substrate included in the insulated-gate transistor according to the first embodiment.

Problem to be Solved by the Present Disclosure

In one embodiment of the MOSFET described in Japanese Patent Laying-Open No. 2014-150126, the element isolation layer is formed of an insulator such as an oxide. A possible method of forming an element isolation layer with an insulator includes forming a trench in a silicon carbide substrate, then filling the trench with an insulator. However, employing such method of formation significantly increases the number of process steps.

An object of the present disclosure is to provide an insulated-gate transistor capable of isolating a sense region from an active region without significantly increasing the number of steps.

Advantageous Effect of the Present Disclosure

According to the present disclosure, an insulated-gate transistor capable of isolating a sense region from an active region without significantly increasing the number of steps can be provided.

SUMMARY OF EMBODIMENTS OF THE PRESENT DISCLOSURE

A summary of embodiments of the present disclosure is initially provided.

(1) An insulated-gate transistor 100 according to the present disclosure includes an active region 10, a sense region 20, an isolation trench 39, a first insulating film 41, a first conductor 42, a second insulating film 61, and a second conductor 62. Sense region 20 is spaced from active region 10. Isolation trench 39 surrounds sense region 20 and isolates sense region 20 from active region 10. Active region 10 includes a first impurity region 12 having a first conductivity type, a second impurity region 13 provided on first impurity region 12 and having a second conductivity type different from the first conductivity type, and a third impurity region 14 provided on second impurity region 13 so as to be separated from first impurity region 12 and having the first conductivity type. Active region 10 is provided with a first gate trench 19 defined by a first side surface 17 and a first bottom surface 18 continuing to first side surface 17. First side surface 17 is formed by first impurity region 12, second impurity region 13 and third impurity region 14. First bottom surface 18 is formed by first impurity region 12. An isolation region 30 is provided with isolation trench 39. First insulating film 41 is in contact with both first side surface 17 and first bottom surface 18. First conductor 42 is provided on first insulating film 41. Second insulating film 61 is provided in isolation trench 39. Second conductor 62 is provided on second insulating film 61. Isolation trench 39 reaches first impurity region 12. First insulating film 41 is made of a material identical to that of second insulating film 61. First conductor 42 is made of a material identical to that of second conductor 62 and is electrically isolated from second conductor 62.

According to insulated-gate transistor 100 according to (1), active region 10 is provided with first gate trench 19 defined by first side surface 17 and first bottom surface 18 continuing to first side surface 17. Isolation trench 39 isolates sense region 20 from active region 10. Sense region 20 is thus electrically isolated from active region 10. First insulating film 41 is in contact with both first side surface 17 and first bottom surface 18. First conductor 42 is provided on first insulating film 41. Second insulating film 61 is provided in isolation trench 39. Second conductor 62 is provided on second insulating film 61. First insulating film 41 is made of a material identical to that of second insulating film 61. First conductor 42 is made of a material identical to that of second conductor 62. Isolation trench 39 can thus be formed simultaneously with first gate trench 19. Thus, sense region 20 can be isolated from active region 10 without an increase in the number of steps. In addition, isolation trench 39 can be readily filled. Further, since isolation trench 39 is filled with second insulating film 61 and second conductor 62, the occurrence of level difference over isolation trench 39 can be suppressed. When forming an aluminum wire for supplying electric power to an electrode, therefore, the occurrence of adhesion failure of the wire can be suppressed.

(2) In insulated-gate transistor 100 according to (1), sense region 20 may include a current sensor element 84.

(3) Insulated-gate transistor 100 according to (2) may include a third insulating film 51 and a third conductor 52. Current sensor element 84 may include a fourth impurity region 22 having the first conductivity type and electrically connected to first impurity region 12, a fifth impurity region 23 having the second conductivity type and provided on fourth impurity region 22, and a sixth impurity region 24 provided on fifth impurity region 23 so as to be separated from fourth impurity region 22 and having the first conductivity type. Sense region 20 may be provided with a second gate trench 29 defined by a second side surface 27 and a second bottom surface 28 continuing to second side surface 27. Second side surface 27 may be formed by fourth impurity region 22, fifth impurity region 23 and sixth impurity region 24. Second bottom surface 28 may be formed by fourth impurity region 22. Third insulating film 51 may be in contact with both second side surface 27 and second bottom surface 28. Third conductor 52 may be provided on third insulating film 51. First conductor 42 may be electrically connected to third conductor 52.

(4) In insulated-gate transistor 100 according to (1), sense region 20 may include a temperature sensor element 85.

(5) Insulated-gate transistor 100 according to (4) may include a source electrode 45 and a fourth conductor 95. Temperature sensor element 85 may include a fourth impurity region 22 having the first conductivity type and electrically connected to first impurity region 12, a fifth impurity region 23 having the second conductivity type and provided on fourth impurity region 22, and aسixth impurity region 91 having the second conductivity type and being higher in impurity concentration than fifth impurity region 23. Source electrode 45 may be electrically connected to third impurity region 14. Fourth conductor 95 may be electrically connected to each of fifth impurity region 23 and sixth impurity region 91. Source electrode 45 may be electrically isolated from fourth conductor 95.

(6) In insulated-gate transistor 100 according to any one of (1) to (5), a depth of isolation trench 39 may be equal to or greater than a depth of first gate trench 19. Active region 10 can thus be more reliably isolated from sense region 20.

(7) In insulated-gate transistor 100 according to (6), the depth of isolation trench 39 may be equal to the depth of first gate trench 19.

(8) In insulated-gate transistor 100 according to any one of (1) to (7), a width of isolation trench 39 in a cross section perpendicular to a direction in which isolation trench 39 extends may be equal to or greater than a width of first gate trench 19 in a cross section perpendicular to a direction in which first gate trench 19 extends. Active region 10 can be more reliably isolated from sense region 20.

(9) In insulated-gate transistor 100 according to any one of (1) to (8), first conductor 42 and second conductor 62 may be made of polysilicon.

(10) In insulated-gate transistor 100 according to (1), sense region 20 may include a current sensor element 84 and a temperature sensor element 85. Sense region 20 may be provided with a boundary trench 67 isolating current sensor element 84 from temperature sensor element 85 and continuing to isolation trench 39.

DETAILS OF EMBODIMENTS OF THE PRESENT DISCLOSURE

Embodiments are described hereinafter with reference to the drawings. The same or corresponding parts in the drawings below are designated by the same reference numbers and the description thereof will not be repeated. Regarding crystallographic denotation herein, an individual orientation, a group orientation, an individual plane, and a group plane are shown in [ ], < >, ( ), and { }, respectively. A crystallographically negative index is normally expressed by a number with a bar "−" thereabove, however, a negative sign herein precedes a number.

First Embodiment

The configuration of a MOSFET 100 as an example of an insulated-gate transistor 100 according to a first embodiment is initially described.

Figure 1:
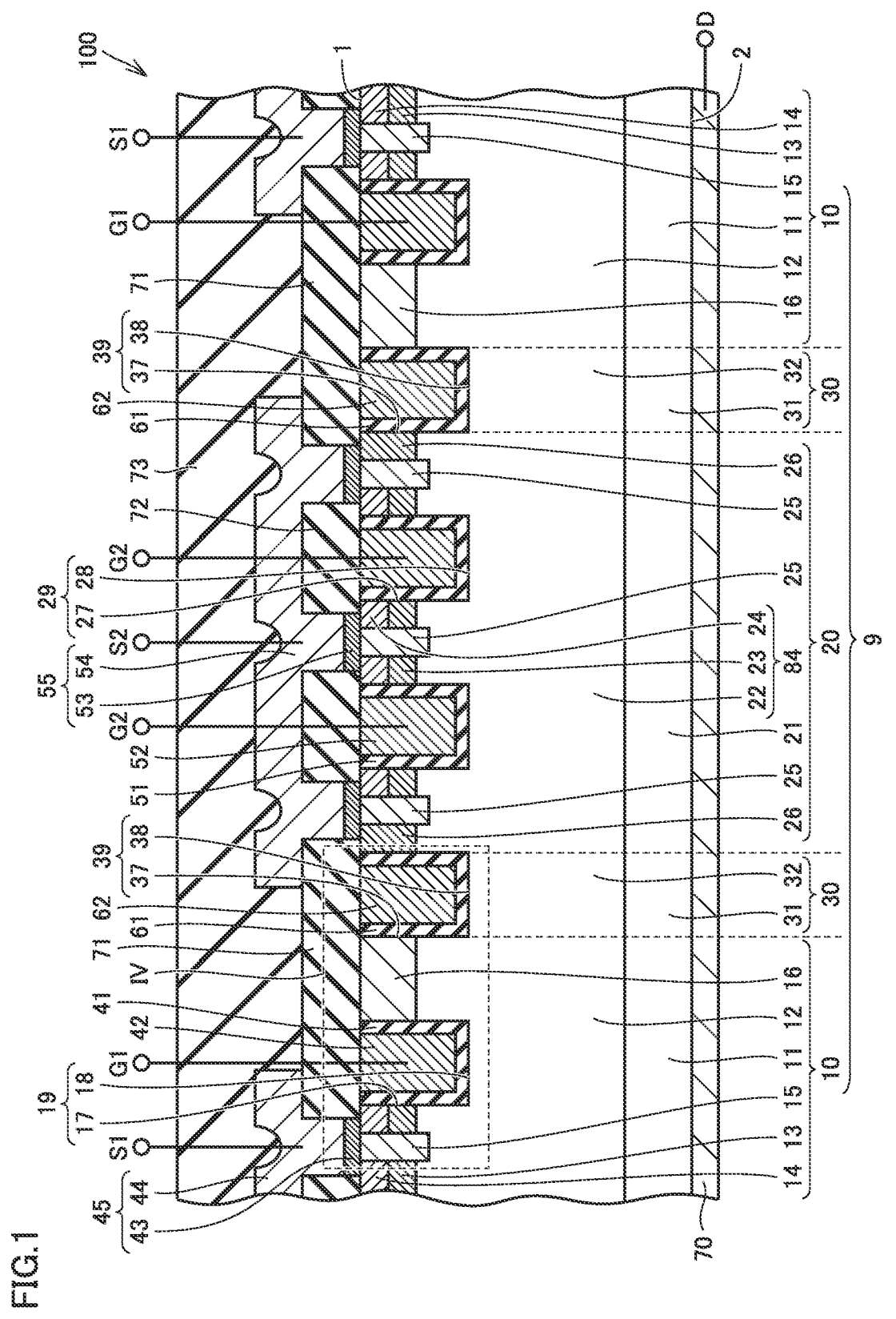

As shown in FIG. 1, the MOSFET according to the first embodiment mainly includes a silicon carbide substrate 9, a first insulating film 41, a third insulating film 51, a second insulating film 61, a first conductor 42, a third conductor 52, a second conductor 62, a first source electrode 45, a second source electrode 55, a first interlayer insulating film 71, a second interlayer insulating film 72, and a passivation layer 73. Silicon carbide substrate 9 mainly includes a first main surface 1, a second main surface 2, an active region 10, a sense region 20, and an isolation region 30. Sense region 20 is separated from active region 10. Isolation region 30 is between active region 10 and sense region 20. Sense region 20 and active region 10 are separated from each other by isolation region 30. Second main surface 2 is opposite to first main surface 1. Each of first main surface 1 and second main surface 2 is formed by active region 10, sense region 20 and isolation region 30. Silicon carbide substrate 9 is made of hexagonal silicon carbide having a polytype of 4H, for example.

First main surface 1 is a {0001} plane, or a plane inclined at an off angle of not more than 8° in an off direction relative to the {0001} plane. Specifically, first main surface 1 is (000-1) plane, or a plane inclined at an off angle of not more than 8° in an off direction relative to the (000-1) plane. The off direction may be a <11-20> direction or a <1-100> direction, for example. The off angle may be not less than 1° or not less than 2°, for example. The off angle may be not more than 6° or not more than 4°.

As shown in FIG. 1, active region 10 mainly includes a first drift region 12 (first impurity region 12), a first body region 13 (second impurity region 13), a first source region 14 (third impurity region 14), a first contact region 15, a first p type region 16, and a first substrate portion 11. First drift region 12 includes an n type impurity such as nitrogen (N), and has n type (first conductivity type). A concentration of the n type impurity in first drift region 12 is not less than $1\times10^{14}$ cm$^{-3}$ and not more than $5\times10^{16}$ cm$^{-3}$, for example. First body region 13 is provided on first drift region 12. First body region 13 includes a p type impurity such as aluminum (Al), and has p type (second conductivity type) different from the n type. The p type impurity in first body region 13 may be higher in concentration than the n type impurity in first drift region 12. A concentration of the p type impurity in first body region 13 is not less than $1\times10^{16}$ cm$^{-3}$ and not more than $5\times10^{18}$ cm$^{-3}$, for example.

First source region 14 is provided on first body region 13 so as to be separated from first drift region 12. First source region 14 includes an n type impurity such as nitrogen or phosphorus (P), and has n type. First source region 14 forms part of first main surface 1, for example. The n type impurity in first source region 14 may be higher in concentration than the p type impurity in first body region 13. A concentration of the n type impurity in first source region 14 is about $1\times10^{19}$ cm$^{-3}$, for example.

First contact region 15 includes a p type impurity such as aluminum, and has p type conductivity. The p type impurity in first contact region 15 is higher in concentration than the p type impurity in first body region 13, for example. First contact region 15 extends through each of first body region 13 and first source region 14, for example. First contact region 15 is in contact with first drift region 12, for example. First contact region 15 forms part of first main surface 1, for example. A concentration of the p type impurity in first contact region 15 is not less than $1\times10^{18}$ cm$^{-3}$ and not more than $1\times10^{20}$ cm$^{-3}$, for example.

First p type region 16 includes a p type impurity such as aluminum, and has p type. First p type region 16 is provided on first drift region 12. First p type region 16 includes a p type impurity such as aluminum, and hasp type. The p type impurity in first p type region 16 may be equal in concentration to the p type impurity in first body region 13. First p type region 16 may be in contact with isolation region 30, for example. First p type region 16 may also be connected to source electrode 45 (S1). First substrate portion 11 includes an n type impurity such as nitrogen (N), and has n type (first conductivity type). First substrate portion 11 forms part of second main surface 2, for example. The n type impurity in first substrate portion 11 may be higher in concentration than the n type impurity in first drift region 12. First drift region 12 is provided on first substrate portion 11, for example.

Active region 10 is provided with a first gate trench 19 defined by a first side surface 17 and a first bottom surface 18. First bottom surface 18 continues to first side surface 17. First side surface 17 is formed by first drift region 12, first body region 13 and first source region 14. First bottom surface 18 is formed by first drift region 12. First side surface 17 extends through each of first body region 13 and first source region 14 and reaches first drift region 12. First bottom surface 18 is a plane parallel to second main surface 2, for example. First side surface 17 is at an angle of 90°, for example, relative to first bottom surface 18.

First side surface 17 may be inclined relative to a plane perpendicular to first bottom surface 18. First side surface 17 may be inclined relative to first bottom surface 18 such that first gate trench 19 increases in width from first bottom surface 18 toward first main surface 1. First gate trench 19 extends as a stripe in a direction parallel to second main surface 2, for example. First gate trench 19 may extend like a honeycomb or may be scattered like islands, for example.

First insulating film 41 is a gate oxide film, for example. First insulating film 41 is made of a material including silicon dioxide, for example. First insulating film 41 is in contact with both first side surface 17 and first bottom surface 18. First insulating film 41 is in contact with first drift region 12 at first bottom surface 18. First insulating film 41 is in contact with each of first drift region 12, first body region 13 and first source region 14 at first side surface 17.

First conductor 42 is a first gate electrode, for example. First conductor 42 is provided on first insulating film 41. First conductor 42 is made of polysilicon including a conductive impurity, for example. First conductor 42 is disposed within first gate trench 19, for example.

First source electrode 45 (first electrode 45) is electrically connected to first source region 14. First source electrode 45 is in contact with each of first source region 14 and first contact region 15 at first main surface 1, for example. First source electrode 45 has a first contact electrode 43 and a first source wire 44. First source wire 44 is provided on first contact electrode 43. First contact electrode 43 may be in contact with each of first source region 14 and first contact region 15 at first main surface 1. First contact electrode 43 is made of a material including Ti, Al and Si, for example. First contact electrode 43 is in ohmic contact with first source region 14, for example. First contact electrode 43 may be in ohmic contact with first contact region 15. First source wire 44 is made of a material including aluminum, for example.

Isolation region 30 is provided with an isolation trench 39. Isolation trench 39 is defined by a third side surface 37 and a third bottom surface 38. Third bottom surface 38 continues to third side surface 37. Isolation region 30 includes a third drift region 32 and a third substrate portion 31, for example. Third bottom surface 38 is formed by third drift region 32. Third bottom surface 38 is a plane parallel to second main surface 2, for example. Third side surface 37 is at an angle of 90°, for example, relative to third bottom surface 38. Third side surface 37 may be inclined relative to a plane perpendicular to third bottom surface 38. Third side surface 37 may be inclined relative to first bottom surface 18 such that isolation trench 39 increases in width from third bottom surface 38 toward first main surface 1.

Isolation trench 39 reaches first impurity region 12. Stated from another perspective, third side surface 37 of isolation trench 39 is partially in contact with first impurity region 12. Isolation trench 39 lies between first p type region 16 and a second p type region 26. Isolation trench 39 is in contact with each of first p type region 16 and second p type region 26.

Second insulating film 61 is an oxide film, for example. Second insulating film 61 is made of a material including silicon dioxide, for example. First insulating film 41 is made of a material identical to that of second insulating film 61. Second insulating film 61 is provided in isolation trench 39. Second insulating film 61 is in contact with both third side surface 37 and third bottom surface 38. Second insulating film 61 is in contact with third drift region 32 at third bottom surface 38. Second insulating film 61 is in contact with each of first p type region 16 and first drift region 12 at third side surface 37, for example.

Second conductor 62 is provided on second insulating film 61. Second conductor 62 is made of polysilicon including a conductive impurity, for example. Second conductor 62 is disposed within isolation trench 39, for example. First conductor 42 is made of a material identical to that of second conductor 62. First conductor 42 is electrically isolated from second conductor 62. Stated from another perspective, second conductor 62 is a floating electrode.

As shown in FIG. 2, as seen in a direction perpendicular to first main surface 1, isolation trench 39 surrounds sense region 20. Isolation trench 39 isolates sense region 20 from active region 10. Isolation trench 39 is provided in isolation region 30. As seen in the direction perpendicular to first main surface 1, isolation region 30 surrounds the outer periphery of sense region 20, for example. Isolation region 30 has an annular shape, for example. Active region 10 surrounds the outer circumference of isolation region 30, for example. Active region 10 has an annular shape, for example. As seen in the direction perpendicular to first main surface 1, sense region 20 has a rectangular shape, for example.

Sense region 20 includes a current sensor element 84, for example. As shown in FIG. 1, sense region 20 mainly includes a second drift region 22 (fourth impurity region 22), a second body region 23 (fifth impurity region 23), a second source region 24 (sixth impurity region 24), a second contact region 25, second p type region 26, and a second substrate portion 21. Second drift region 22, second body region 23 and second source region 24 form current sensor element 84, for example.

Second drift region 22 includes an n type impurity such as nitrogen, and has n type (first conductivity type). Second drift region 22 is electrically connected to first drift region 12. The n type impurity in second drift region 22 may be equal in concentration to the n type impurity in first drift region 12. Second body region 23 includes a p type impurity such as aluminum (Al), and has p type. Second body region 23 is provided on second drift region 22. The p type impurity in second body region 23 may be higher in concentration than the n type impurity in second drift region 22. The p type impurity in second body region 23 may be equal in concentration to the p type impurity in first body region 13. Second body region 23 is electrically isolated from first body region 13, for example.

Second source region 24 is provided on second body region 23 so as to be separated from second drift region 22. Second source region 24 includes an n type impurity such as nitrogen or phosphorus (P), and has n type. Second source region 24 forms part of first main surface 1, for example. The n type impurity in second source region 24 may be higher in concentration than the p type impurity in second body region 23. The n type impurity in second source region 24 may be equal in concentration to the n type impurity in first source region 14. Second source region 24 is electrically isolated from first source region 14, for example.

Second contact region 25 includes a p type impurity such as aluminum, and has p type conductivity. The p type impurity in second contact region 25 is higher in concentration than the p type impurity in second body region 23, for example. Second contact region 25 extends through each of second body region 23 and second source region 24, for example. Second contact region 25 is in contact with second drift region 22, for example. Second contact region 25 forms part of first main surface 1, for example. The p type impurity in second contact region 25 may be equal in concentration to the p type impurity in first contact region 15. Second contact region 25 is electrically isolated from first contact region 15, for example.

Second p type region 26 is provided on second drift region 22. Second p type region 26 includes a p type impurity such as aluminum, and has p type. The p type impurity in second p type region 26 may be equal in concentration to the p type impurity in second body region 23. Second p type region 26 may be in contact with third side surface 37 of isolation trench 39, for example. Second substrate portion 21 includes an n type impurity such as nitrogen, and has n type. Second substrate portion 21 forms part of second main surface 2, for example. The n type impurity in second substrate portion 21 may be higher in concentration than the n type impurity in second drift region 22. Second drift region 22 is provided on second substrate portion 21, for example. Second substrate portion 21 continues to first substrate portion 11.

Sense region 20 may be provided with a second gate trench 29 defined by a second side surface 27 and a second bottom surface 28. Second bottom surface 28 continues to second side surface 27. Second side surface 27 is formed by second drift region 22, second body region 23 and second source region 24, for example. Second bottom surface 28 is formed by second drift region 22, for example. Second side surface 27 extends through each of second body region 23 and second source region 24 and reaches second drift region 22. Second bottom surface 28 is a plane parallel to second main surface 2, for example. First side surface 17 is at an angle of 90°, for example, relative to second bottom surface 28.

Second side surface 27 may be inclined relative to a plane perpendicular to second bottom surface 28. Second side surface 27 may be inclined relative to second bottom surface 28 such that second gate trench 29 increases in width from second bottom surface 28 toward first main surface 1. Second gate trench 29 extends as a stripe in the direction parallel to second main surface 2, for example. Second gate trench 29 may extend like a honeycomb or may be scattered like islands, for example.

Third insulating film 51 is a gate oxide film, for example. Third insulating film 51 is made of a material including silicon dioxide, for example. Third insulating film 51 is in contact with both second side surface 27 and second bottom surface 28, for example. Third insulating film 51 is in contact with second drift region 22 at second bottom surface 28. Third insulating film 51 is in contact with each of second drift region 22, second body region 23 and second source region 24 at second side surface 27.

Third conductor 52 is a second gate electrode, for example. Third conductor 52 may be provided on third insulating film 51. Third conductor 52 is made of polysilicon including a conductive impurity, for example. Third conductor 52 is disposed within second gate trench 29, for example. First conductor 42 is electrically connected to third conductor 52. First conductor 42 and second conductor 62 are made of an identical material. First conductor 42 and third conductor 52 may also be made of an identical material.

Second source electrode 55 is electrically connected to second source region 24. Second source electrode 55 is in contact with each of second source region 24 and second contact region 25 at first main surface 1, for example. Second source electrode 55 has a second contact electrode 53 and a second source wire 54. Second source wire 54 is provided on second contact electrode 53. Second contact electrode 53 may be in contact with each of second source region 24 and second contact region 25 at first main surface 1. Second contact electrode 53 is made of a material including Ti, Al and Si, for example. Second contact electrode 53 is in ohmic contact with second source region 24, for example. Second contact electrode 53 may be in ohmic contact with second contact region 25. Second source wire 54 is made of a material including aluminum, for example. First source electrode 45 is electrically isolated from second source electrode 55, for example.

First interlayer insulating film 71 is provided to cover each of first gate trench 19 and isolation trench 39, for example. First interlayer insulating film 71 is provided in contact with first conductor 42, first insulating film 41, second conductor 62 and second insulating film 61, for example. First interlayer insulating film 71 may be in contact with first source region 14, first p type region 16 and second p type region 26 at first main surface 1. First interlayer insulating film 71 may be provided on each of active region 10, sense region 20 and isolation region 30.

Second interlayer insulating film 72 is provided to cover second gate trench 29, for example. Second interlayer insulating film 72 is provided in contact with third conductor 52 and third insulating film 51, for example. Second interlayer insulating film 72 may be in contact with second source region 24 at first main surface 1. Second interlayer insulating film 72 may be provided on sense region 20 and spaced from each of active region 10 and isolation region 30, for example.

Each of first interlayer insulating film 71 and second interlayer insulating film 72 is made of a material including silicon dioxide, for example. First interlayer insulating film 71 electrically insulates first conductor 42 from first source electrode 45, for example. Second interlayer insulating film 72 electrically insulates third conductor 52 from second source electrode 55, for example. Passivation layer 73 is provided in contact with first source electrode 45, second source electrode 55 and first interlayer insulating film 71. Passivation layer 73 is made of a material such as silicon nitride (SiN), silicon dioxide or polyimide.

Drain electrode 70 (second electrode 70) is in contact with second main surface 2. Stated from another perspective, drain electrode 70 is in contact with each of first substrate portion 11, second substrate portion 21 and third substrate portion 31 at second main surface 2. Drain electrode 70 is electrically connected to each of first drift region 12, second drift region 22 and third drift region 32. Drain electrode 70 is made of a material including NiSi or TiAlSi, for example. Drain electrode 70 is provided to cover each of active region 10, sense region 20 and isolation region 30.

Figure 3:
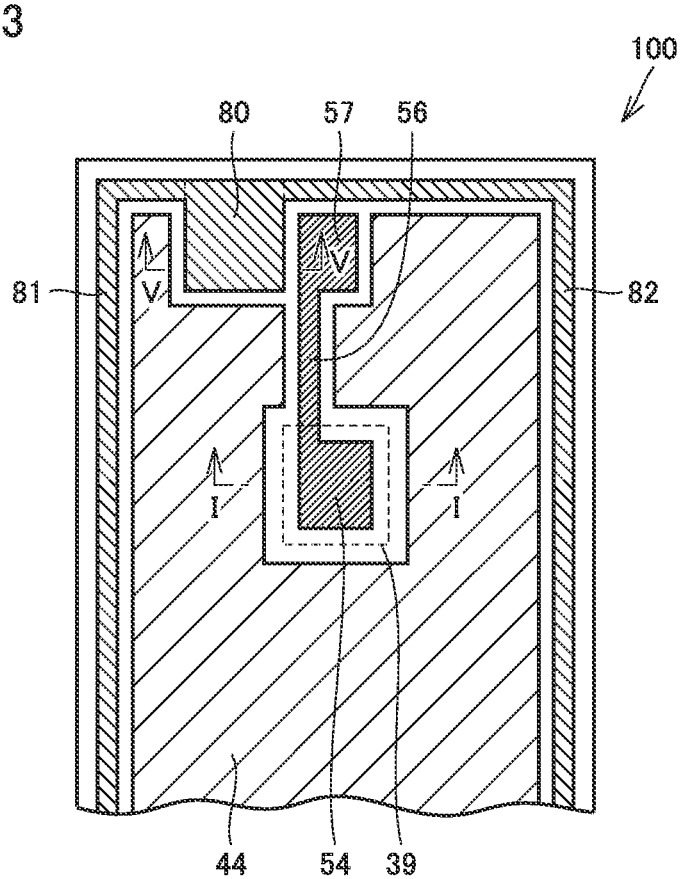
FIG. 3 is a schematic plan view showing the configuration of the insulated-gate transistor according to the first embodiment.

As shown in FIG. 3, the MOSFET according to the first embodiment may further include a gate pad 80, a first gate runner 81, a second gate runner 82, a source pad 57, and a source wire region 56. First gate runner 81 is connected to one side of gate pad 80. Second gate runner 82 is connected to the other side of gate pad 80. As shown in FIG. 3, as seen in a direction perpendicular to second main surface 2, each of first source wire 44, source pad 57 and source wire region 56 lies between first gate runner 81 and second gate runner 82. Gate pad 80 is electrically connected to each of first conductor 42 and third conductor 52.

First source wire 44 is electrically isolated from second source wire 54. Source pad 57 is connected to second source wire 54 via source wire region 56. Source pad 57 is located next to gate pad 80. Source pad 57 is electrically isolated from gate pad 80. As seen in the direction perpendicular to second main surface 2, second source wire 54 may be surrounded by isolation region 30.

Second source wire 54 is disposed on sense region 20. Source pad 57 may be disposed on active region 10. Source wire region 56 may be disposed on each of active region 10, isolation region 30 and sense region 20. As seen in the direction perpendicular to second main surface 2, source wire region 56 may be provided to traverse isolation region 30 in a direction substantially perpendicular to a direction in which isolation region 30 extends. Each of gate pad 80, first gate runner 81, second gate runner 82 and first source wire 44 is disposed on active region 10, for example.

Figure 4:
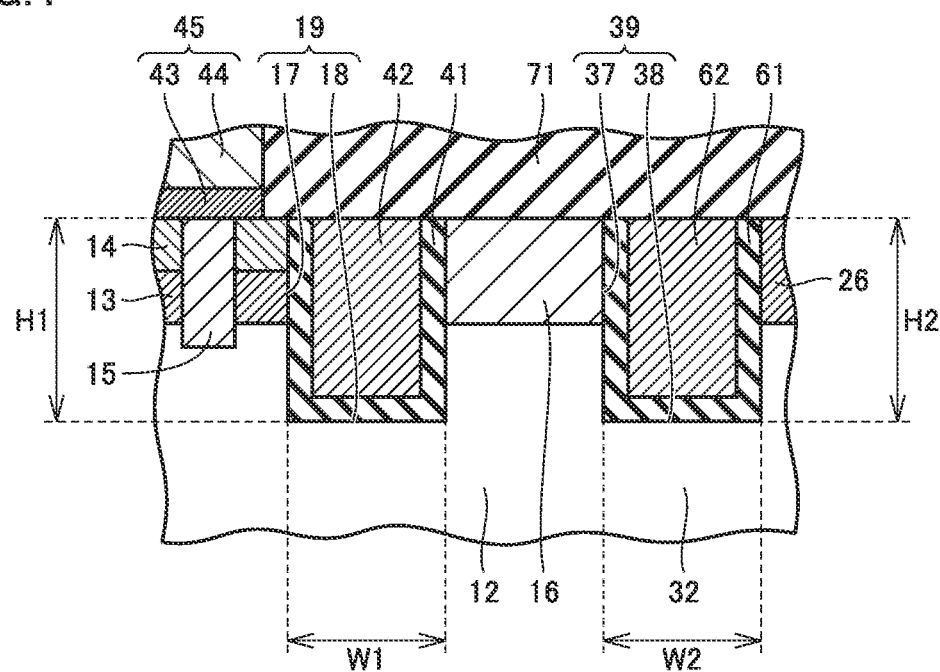
FIG. 4 is an enlarged view of a region IV in FIG. 1.

As shown in FIG. 4, a depth H2 of isolation trench 39 may be equal to or greater than a depth H1 of first gate trench 19. The depth of isolation trench 39 may be equal to depth H1 of first gate trench 19, or greater than depth H1 of first gate trench 19. Depth H1 of first gate trench 19 is not less than 0.5 µm and not more than 3.0 µm, for example. Depth H2 of isolation trench 39 is not less than 0.5 µm and not more than 20.0 µm, for example. The depth of isolation trench 39 may be equal to the depth of second gate trench 29, or greater than the depth of second gate trench 29.

As shown in FIG. 4, a width W2 of isolation trench 39 in a cross section perpendicular to a direction in which isolation trench 39 extends may be equal to or greater than a width W1 of first gate trench 19 in a cross section perpendicular to a direction in which first gate trench 19 extends. Width W2 of isolation trench 39 may be equal to width W1 of first gate trench 19, or greater than width W1 of first gate trench 19. Width W1 of first gate trench 19 is not less than 0.2 µm and not more than 2.0 µm, for example. Width W2 of isolation trench 39 is not less than 0.2 µm and not more than 200 µm, for example. The width of isolation trench 39 may be equal to the width of second gate trench 29, or greater than the width of second gate trench 29. A direction in which a trench extends refers to a direction parallel to a bottom surface of the trench and parallel to a side surface of the trench.

Figure 5:
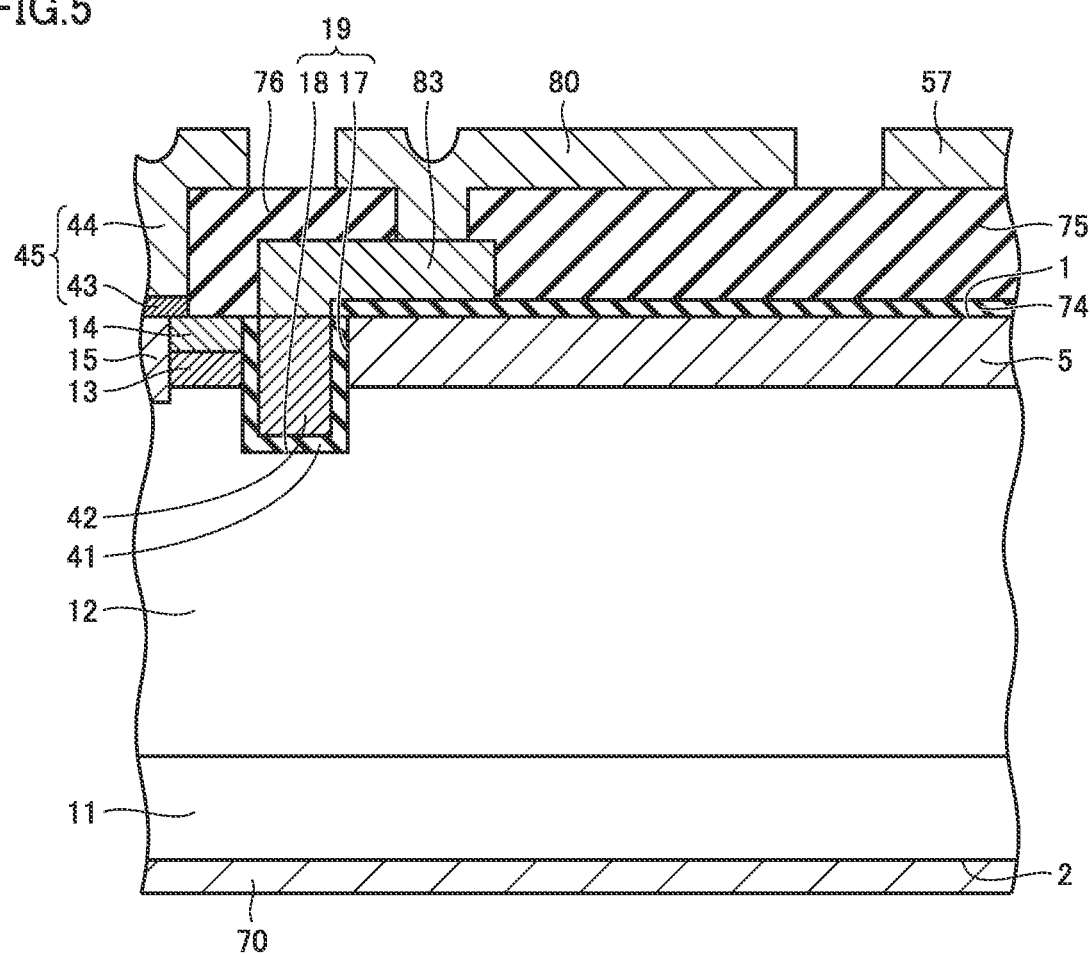
FIG. 5 is a schematic cross-sectional view taken along line V-V in a direction of arrows in FIG. 3.

As shown in FIG. 5, the MOSFET according to the first embodiment may further include a gate connection wire 83, a first insulating layer 74, a second insulating layer 75, and a third interlayer insulating film 76. Active region 10 may further include a third p type region 5. Third p type region 5 is provided on first drift region 12. Third p type region 5 includes a p type impurity such as aluminum, and has p type. The p type impurity in third p type region 5 may be equal in concentration to the p type impurity in first body region 13. Third p type region 5 may be in contact with first side surface 17 of first gate trench 19, for example.

First insulating layer 74 is disposed on third p type region 5. First insulating layer 74 is in contact with third p type region 5 at first main surface 1. Gate connection wire 83 is disposed on first conductor 42. Gate connection wire 83 connects first conductor 42 to gate pad 80. Gate pad 80 is in contact with gate connection wire 83. Gate connection wire 83 may be disposed on first insulating layer 74. First insulating layer 74 may be in contact with first insulating film 41. Gate connection wire 83 may be disposed between gate pad 80 and first insulating layer 74.

Second insulating layer 75 is disposed on first insulating layer 74, for example. Second insulating layer 75 may be in contact with gate connection wire 83. Third interlayer insulating film 76 is disposed between first source electrode 45 and gate connection wire 83, for example. Third interlayer insulating film 76 electrically insulates first source electrode 45 from gate connection wire 83, for example. Third interlayer insulating film 76 may be disposed on gate connection wire 83. Gate pad 80 may be disposed on each of third interlayer insulating film 76 and second insulating layer 75. Gate pad 80 may be disposed to face third p type region 5.

Operation of the current sensor included in the MOSFET according to the first embodiment will now be described.

As shown in FIG. 1, first source wire 44 is connected to a first source terminal S1. Second source wire 54 is connected to a second source terminal S2. Drain electrode 70 is connected to a drain terminal D. First gate electrode 42 is connected to a first gate terminal G1. Second gate electrode 52 is connected to a second gate terminal G2. First gate terminal G1 is electrically connected to second gate terminal G2.

When a gate voltage is applied to each of first gate terminal G1 and second gate terminal G2, a current flows between first source terminal S1 and drain terminal D, and a current also flows between second source terminal S2 and drain terminal D. The current flowing between second source terminal S2 and drain terminal D is substantially proportional to the current flowing between first source terminal S1 and drain terminal D. For example, when a current of 100 A flows between first source terminal S1 and drain terminal D, a current of 1 mA flows between second source terminal S2 and drain terminal D. The current flowing between second source terminal S2 and drain terminal D can be adjusted by changing the number of cells, a gate width and the like.

A relational expression between the current flowing between second source terminal S2 and drain terminal D and the current flowing between first source terminal S1 and drain terminal D is predetermined. The current flowing between second source terminal S2 and drain terminal D is monitored by an ammeter (not shown). Based on this relational expression, the current flowing between first source terminal S1 and drain terminal D is estimated from the current flowing between second source terminal S2 and drain terminal D. MOSFET 100 may be controlled, for example, such that the application of the gate voltage is stopped when the current flowing between second source terminal S2 and drain terminal D exceeds a prescribed value.

Functions and effect of the MOSFET according to the first embodiment will now be described.

According to the MOSFET according to the first embodiment, active region 10 is provided with first gate trench 19 defined by first side surface 17 and first bottom surface 18 continuing to first side surface 17. Isolation trench 39 isolates sense region 20 from active region 10. Sense region 20 is thus electrically isolated from active region 10. First insulating film 41 is in contact with both first side surface 17 and first bottom surface 18. First conductor 42 is provided on first insulating film 41. Second insulating film 61 is provided in isolation trench 39. Second conductor 62 is provided on second insulating film 61. First insulating film 41 is made of a material identical to that of second insulating film 61. First conductor 42 is made of a material identical to that of second conductor 62 and is electrically isolated from second conductor 62. Isolation trench 39 can thus be formed simultaneously with first gate trench 19. Thus, sense region 20 can be isolated from active region 10 without an increase in the number of steps. In addition, isolation trench 39 can be readily filled. Further, since isolation trench 39 is filled with second insulating film 61 and second conductor 62, the occurrence of level difference over isolation trench 39 can be suppressed. When forming an aluminum wire for supplying electric power to an electrode, therefore, the occurrence of adhesion failure of the wire can be suppressed.

In addition, according to the MOSFET according to the first embodiment, the depth of isolation trench 39 may be equal to or greater than the depth of first gate trench 19. Active region 10 can thus be more reliably isolated from sense region 20.

Further, according to the MOSFET according to the first embodiment, the width of isolation trench 39 in the cross section perpendicular to the direction in which isolation trench 39 extends may be equal to or greater than the width of first gate trench 19 in the cross section perpendicular to the direction in which first gate trench 19 extends. Active region 10 can be more reliably isolated from sense region 20.

Second Embodiment

The configuration of MOSFET 100 according to a second embodiment will now be described. The MOSFET according to the second embodiment is different in configuration from the MOSFET according to the first embodiment in that it includes a temperature sensor instead of the current sensor element, and is otherwise substantially the same in configuration as the MOSFET according to the first embodiment. The configuration different from the MOSFET according to the first embodiment is mainly described hereinafter.

Figure 6:
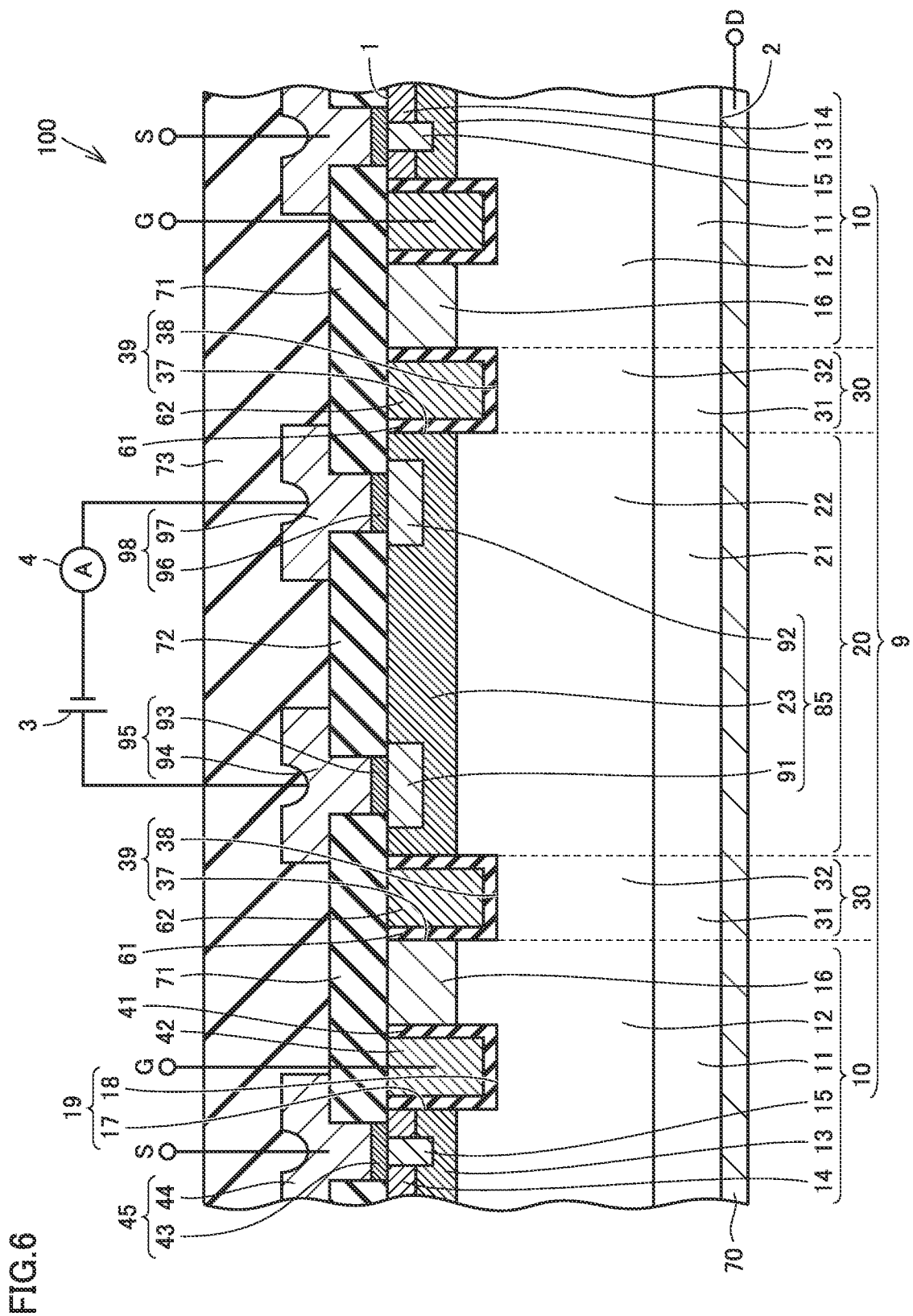
FIG. 6 is a schematic cross-sectional view showing the configuration of an insulated-gate transistor according to a second embodiment, and corresponds to a schematic cross-sectional view taken along line VI-VI in a direction of arrows in FIG. 7.

Sense region 20 may include a temperature sensor element. As shown in FIG. 6, sense region 20 mainly includes fourth impurity region 22, fifth impurity region 23, a third contact region 91 (sixth impurity region 91), a fourth contact region 92, and second substrate portion 21. Fifth impurity region 23, third contact region 91 and fourth contact region 92 form a temperature sensor element 85, for example. Temperature sensor element 85 is an electrical resistor, for example. Temperature dependence of the electrical resistor can be utilized to estimate the temperature from a resistance value of the electrical resistor.

Fourth impurity region 22 includes an n type impurity such as nitrogen, and has n type (first conductivity type). Fourth impurity region 22 is electrically connected to first drift region 12. The n type impurity in fourth impurity region 22 may be equal in concentration to the n type impurity in first drift region 12. Fifth impurity region 23 includes a p type impurity such as aluminum (Al), and has p type. Fifth impurity region 23 is provided on fourth impurity region 22. The p type impurity in fifth impurity region 23 may be higher in concentration than the n type impurity in fourth impurity region 22. The p type impurity in fifth impurity region 23 may be equal in concentration to the p type impurity in first body region 13. Fifth impurity region 23 may be in contact with third side surface 37 of isolation trench 39, for example. Fifth impurity region 23 is electrically isolated from first body region 13, for example.

Each of third contact region 91 and fourth contact region 92 includes a p type impurity such as aluminum, and has p type conductivity. The p type impurity in each of third contact region 91 and fourth contact region 92 is higher in concentration than the p type impurity in fifth impurity region 23, for example. Each of third contact region 91 and fourth contact region 92 is in contact with fifth impurity region 23. Each of third contact region 91 and fourth contact region 92 forms part of first main surface 1, for example. The p type impurity in each of third contact region 91 and fourth contact region 92 may be equal in concentration to the p type impurity in first contact region 15.

Second substrate portion 21 includes an n type impurity such as nitrogen, and has n type. Second substrate portion 21 forms part of second main surface 2, for example. The n type impurity in second substrate portion 21 may be higher in concentration than the n type impurity in fourth impurity region 22. Fourth impurity region 22 is provided on second substrate portion 21, for example. Second substrate portion 21 continues to third substrate portion 31.

The MOSFET according to the second embodiment further includes a fourth conductor 95 and a fourth electrode 98. Fourth conductor 95 is a third electrode. Fourth conductor 95 is electrically connected to each of fifth impurity region 23, third contact region 91 and fourth contact region 92, for example. Fourth conductor 95 is in contact with third contact region 91 at first main surface 1, for example. Fourth conductor 95 has a third contact electrode 93 and a third wire 94. Third wire 94 is provided on third contact electrode 93. Third contact electrode 93 may be in contact with third contact region 91 at first main surface 1. Third contact electrode 93 is made of a material including Ti, Al and Si, for example. Third contact electrode 93 may be in ohmic contact with third contact region 91. Third wire 94 is made of a material including aluminum, for example. Fourth conductor 95 may be connected to a power supply 3, for example.

Fourth electrode 98 is electrically connected to each of fifth impurity region 23, third contact region 91 and fourth contact region 92, for example. Fourth electrode 98 is in contact with fourth contact region 92 at first main surface 1, for example. Fourth electrode 98 has a fourth contact electrode 96 and a fourth wire 97. Fourth wire 97 is provided on fourth contact electrode 96. Fourth contact electrode 96 may be in contact with fourth contact region 92 at first main surface 1. Fourth contact electrode 96 is made of a material including Ti, Al and Si, for example. Fourth contact electrode 96 may be in ohmic contact with fourth contact region 92. Fourth wire 97 is made of a material including aluminum, for example. Fourth electrode 98 may be connected to an ammeter 4, for example. First source electrode 45 is electrically isolated from each of fourth conductor 95 and fourth electrode 98.

Second interlayer insulating film 72 is provided to cover part of first main surface 1. Second interlayer insulating film 72 is provided in contact with each of fifth impurity region 23, third contact region 91 and fourth contact region 92, for example, at first main surface 1. Second interlayer insulating film 72 may be provided on sense region 20 and spaced from each of active region 10 and isolation region 30, for example. Second interlayer insulating film 72 is made of a material including silicon dioxide, for example. Second interlayer insulating film 72 is located between fourth conductor 95 and fourth electrode 98, for example.

Figure 7:
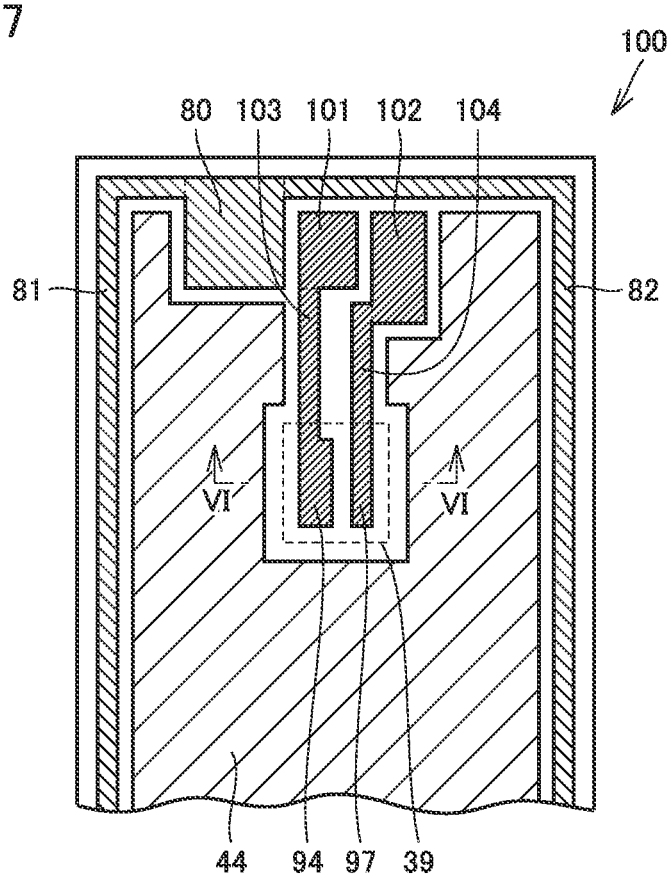
FIG. 7 is a schematic plan view showing the configuration of the insulated-gate transistor according to the second embodiment.

As shown in FIG. 7, the MOSFET according to the second embodiment may further include a third pad 101, a fourth pad 102, a third connection wire 103, and a fourth connection wire 104. As shown in FIG. 7, as seen in the direction perpendicular to second main surface 2, each of third pad 101, fourth pad 102, third connection wire 103 and fourth connection wire 104 may lie between first gate runner 81 and second gate runner 82.

Third pad 101 is electrically connected to third wire 94. Third pad 101 is connected to third wire 94 via third connection wire 103. Third pad 101 is located next to gate pad 80. Fourth pad 102 is electrically connected to fourth wire 97. Fourth pad 102 is connected to fourth wire 97 via fourth connection wire 104. Each of third pad 101 and fourth pad 102 is electrically isolated from gate pad 80. Third pad 101 is physically isolated from fourth pad 102. Each of third pad 101 and fourth pad 102 is electrically isolated from source wire 44.

As seen in the direction perpendicular to second main surface 2, each of fourth conductor 95 and fourth electrode 98 may be surrounded by isolation region 30. Each of fourth conductor 95 and fourth electrode 98 is disposed on sense region 20. Each of third pad 101 and fourth pad 102 may be disposed on active region 10. Each of third wire 94 and fourth wire 97 may be disposed on each of active region 10, isolation region 30 and sense region 20. As seen in the direction perpendicular to second main surface 2, each of third connection wire 103 and fourth connection wire 104 may be provided to traverse isolation region 30 in the direction substantially perpendicular to the direction in which isolation region 30 extends. Third connection wire 103 may extend substantially parallel to fourth connection wire 104. MOSFET 100 according to the second embodiment also has the same functions and effect as those of MOSFET 100 according to the first embodiment.

Operation of the temperature sensor included in the MOSFET according to the second embodiment will now be described.

As shown in FIG. 6, third electrode 95 is connected to the positive side of power supply 3. Fourth electrode 98 is connected to the negative side of power supply 3. Ammeter 4 is provided between fourth electrode 98 and the negative electrode of power supply 3. When a voltage is applied between third electrode 95 and fourth electrode 98 using power supply 3, a current flows between third electrode 95 and fourth electrode 98 through third contact region 91, fifth impurity region 23 and fourth contact region 92. The current flowing between third electrode 95 and fourth electrode 98 is detected by ammeter 4.

Third contact region 91, fifth impurity region 23 and fourth contact region 92 form temperature sensor element 85. Temperature sensor element 85 is an electrical resistor, for example. Temperature sensor element 85 has electrical resistance that varies with temperature. For example, temperature sensor element 85 increases in electrical resistance as temperature sensor element 85 increases in temperature. As a result, the current measured by ammeter 4 decreases. Conversely, temperature sensor element 85 decreases in electrical resistance as temperature sensor element 85 decreases in temperature. As a result, the current measured by ammeter 4 increases. In this manner, the temperature of temperature sensor element 85 can be estimated based on the current measured by ammeter 4.

A relational expression between the temperature of temperature sensor element 85 and the current measured by ammeter 4 is predetermined. The current flowing in temperature sensor element 85 is monitored by ammeter 4. Based on this relational expression, the temperature of temperature sensor element 85 is estimated from the current measured by ammeter 4. MOSFET 100 may be controlled, for example, such that the application of a gate voltage is stopped when the current measured by ammeter 4 exceeds a prescribed value.

Third Embodiment

The configuration of MOSFET 100 according to a third embodiment will now be described. The MOSFET according to the third embodiment is different in configuration from the MOSFET according to the second embodiment in that the temperature sensor element is a diode, and is otherwise substantially the same in configuration as the MOSFET according to the second embodiment. The configuration different from the MOSFET according to the second embodiment is mainly described hereinafter.

Figure 8:
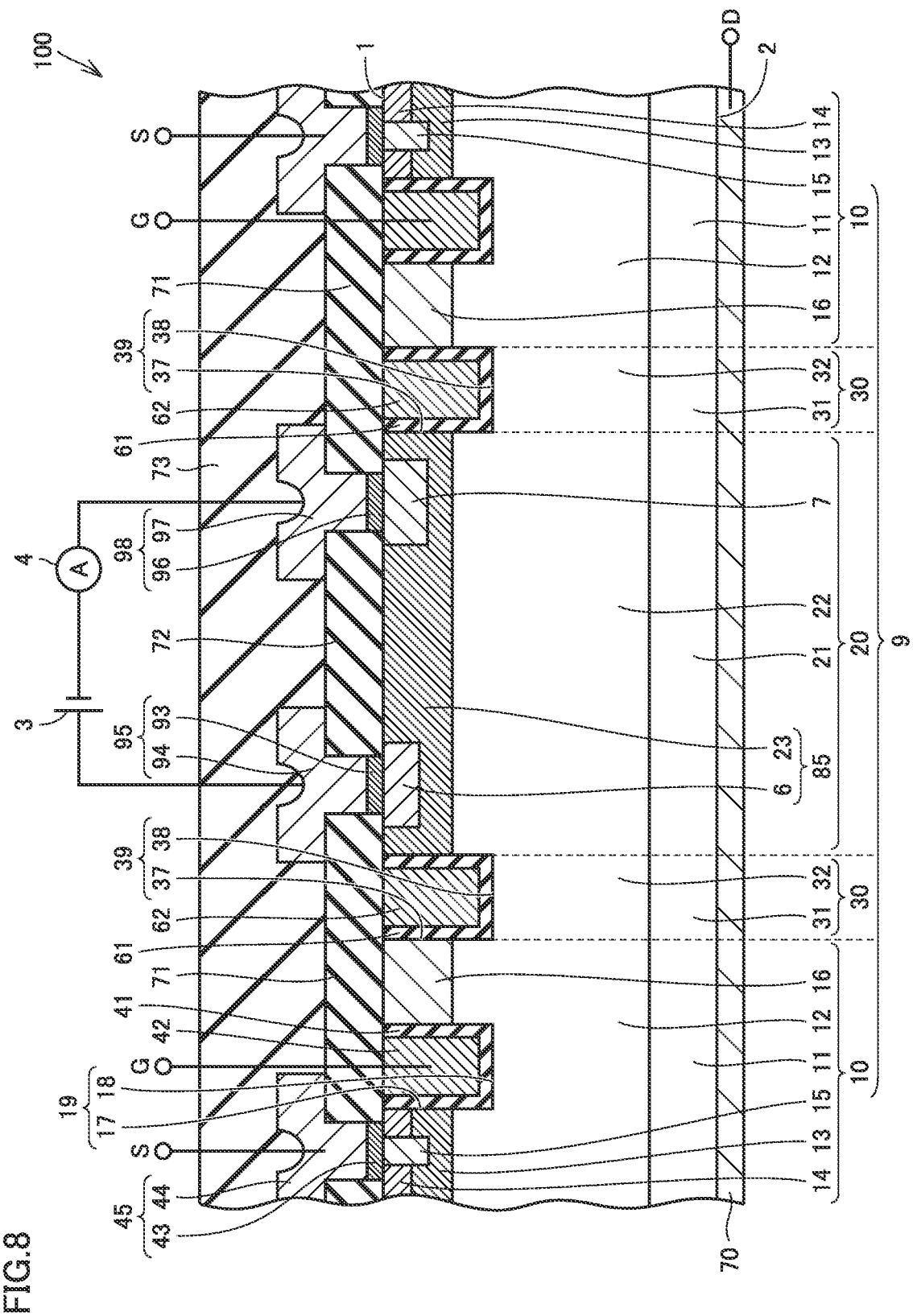
FIG. 8 is a schematic cross-sectional view showing the configuration of an insulated-gate transistor according to a third embodiment.

As shown in FIG. 8, sense region 20 mainly includes fourth impurity region 22, fifth impurity region 23, an n type region 6, a fifth contact region 7, and second substrate portion 21. Fifth impurity region 23 (p type region) and n type region 6 form temperature sensor element 85, for example. Temperature sensor element 85 is a diode, for example.

Fifth impurity region 23 includes a p type impurity such as aluminum (Al), and has p type. Fifth impurity region 23 is provided on fourth impurity region 22. The p type impurity in fifth impurity region 23 may be higher in concentration than the n type impurity in fourth impurity region 22. The p type impurity in fifth impurity region 23 may be equal in concentration to the p type impurity in first body region 13. Fifth impurity region 23 may be in contact with third side surface 37 of isolation trench 39, for example. Fifth impurity region 23 is electrically isolated from first body region 13.

N type region 6 is provided on fifth impurity region 23 so as to be separated from fourth impurity region 22. N type region 6 includes an n type impurity such as nitrogen or phosphorus (P), and has n type. N type region 6 forms part of first main surface 1, for example. The n type impurity in n type region 6 may be higher in concentration than the p type impurity in fifth impurity region 23. The n type impurity in n type region 6 may be equal in concentration to the n type impurity in first source region 14. N type region 6 connects to fourth conductor 95.

Fifth contact region 7 includes a p type impurity such as aluminum, and has p type conductivity. The p type impurity in fifth contact region 7 is higher in concentration than the p type impurity in fifth impurity region 23, for example. Fifth contact region 7 is in contact with fifth impurity region 23. Fifth contact region 7 forms part of first main surface 1, for example. The p type impurity in fifth contact region 7 may be equal in concentration to the p type impurity in first contact region 15. Fifth contact region 7 connects to fourth electrode 98. MOSFET 100 according to the third embodiment also has the same functions and effect as those of MOSFET 100 according to the first embodiment.

Fourth Embodiment

The configuration of MOSFET 100 according to a fourth embodiment will now be described. The MOSFET according to the fourth embodiment has a configuration that combines the MOSFET according to the first embodiment including the current sensor element and the MOSFET according to the second or third embodiment including the temperature sensor. The configuration different from the MOSFET according to each of the first to third embodiments is mainly described hereinafter.

Figure 9:
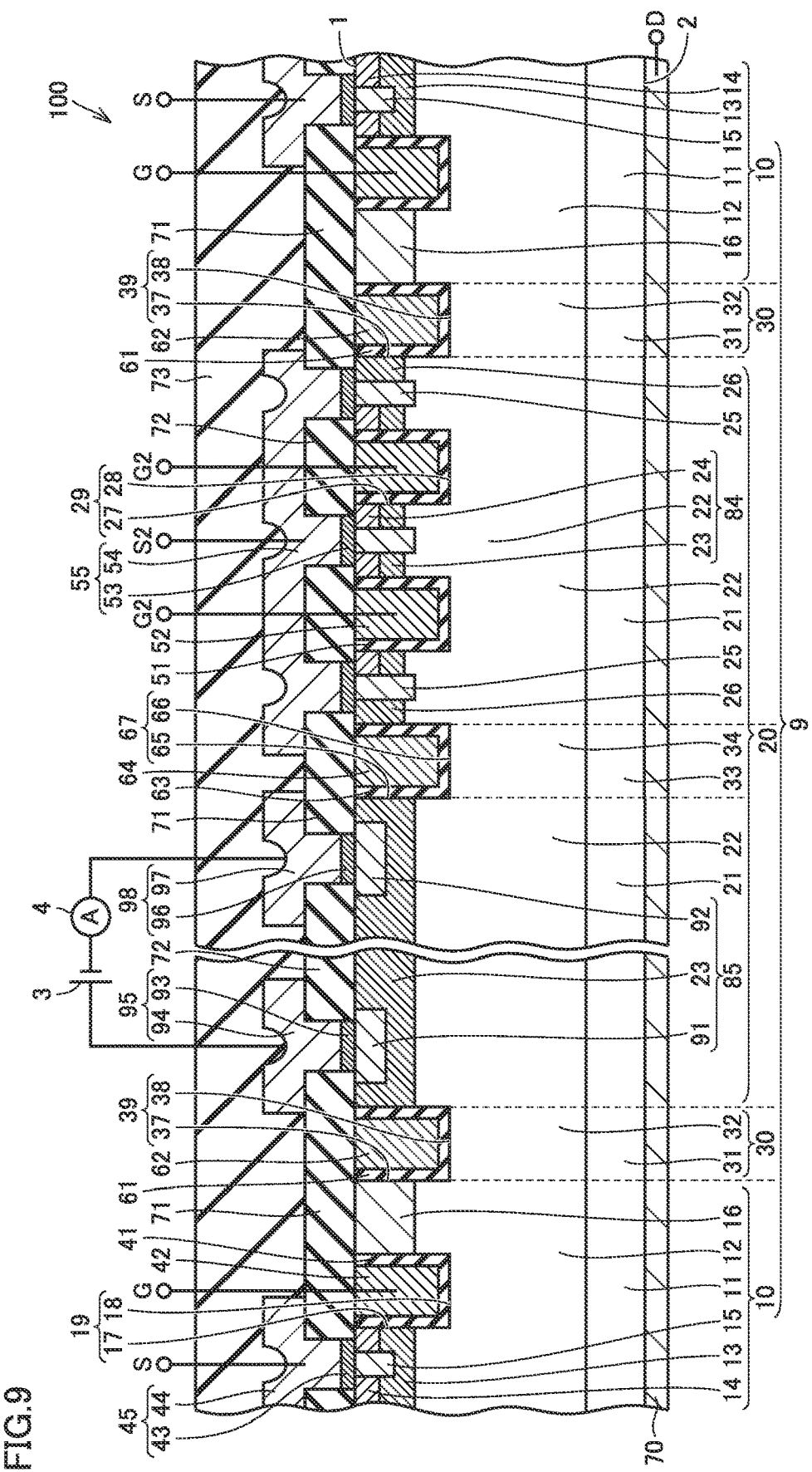
FIG. 9 is a schematic cross-sectional view taken along line X-X in a direction of arrows in FIG. 10.

As shown in FIG. 9, sense region 20 includes current sensor element 84 and temperature sensor element 85. Specifically, sense region 20 includes second drift region 22, second body region 23, second source region 24, second contact region 25, second p type region 26, second substrate portion 21, third contact region 91, and fourth contact region 92. Current sensor element 84 is formed by second drift region 22, second body region 23 and second source region 24, for example. Temperature sensor element 85 is formed by third contact region 91, second body region 23 and fourth contact region 92, for example. Temperature sensor element 85 is an electrical resistor, for example.

As shown in FIG. 9, sense region 20 is provided with a boundary trench 67. Boundary trench 67 isolates current sensor element 84 from temperature sensor element 85. Sense region 20 further includes a fourth drift region 34 and a fourth substrate portion 33. Fourth drift region 34 continues to second drift region 22. Fourth substrate portion 33 continues to second substrate portion 21. Boundary trench 67 is defined by a fourth side surface 65 and a fourth bottom surface 66. Fourth side surface 65 is in contact with second drift region 22. Boundary trench 67 electrically isolates second body region 23 of current sensor element 84 from second p type region 26 of temperature sensor element 85.

Fourth bottom surface 66 continues to fourth side surface 65. Fourth bottom surface 66 is formed by fourth drift region 34. Fourth bottom surface 66 is a plane parallel to second main surface 2, for example. Fourth side surface 65 is at an angle of 90°, for example, relative to fourth bottom surface 66. Fourth side surface 65 may be inclined relative to a plane perpendicular to fourth bottom surface 66. Fourth side surface 65 may be inclined relative to fourth bottom surface 66 such that boundary trench 67 increases in width from fourth bottom surface 66 toward first main surface 1.

A fourth insulating film 63 is provided within boundary trench 67. Fourth insulating film 63 is in contact with each of fourth side surface 65 and fourth bottom surface 66. A fifth conductor 64 is provided on fourth insulating film 63. Fifth conductor 64 is disposed within boundary trench 67. Fourth insulating film 63 is made of a material identical to that of second insulating film 61, for example. Fifth conductor 64 is made of a material identical to that of second conductor 62, for example.

Figure 10:
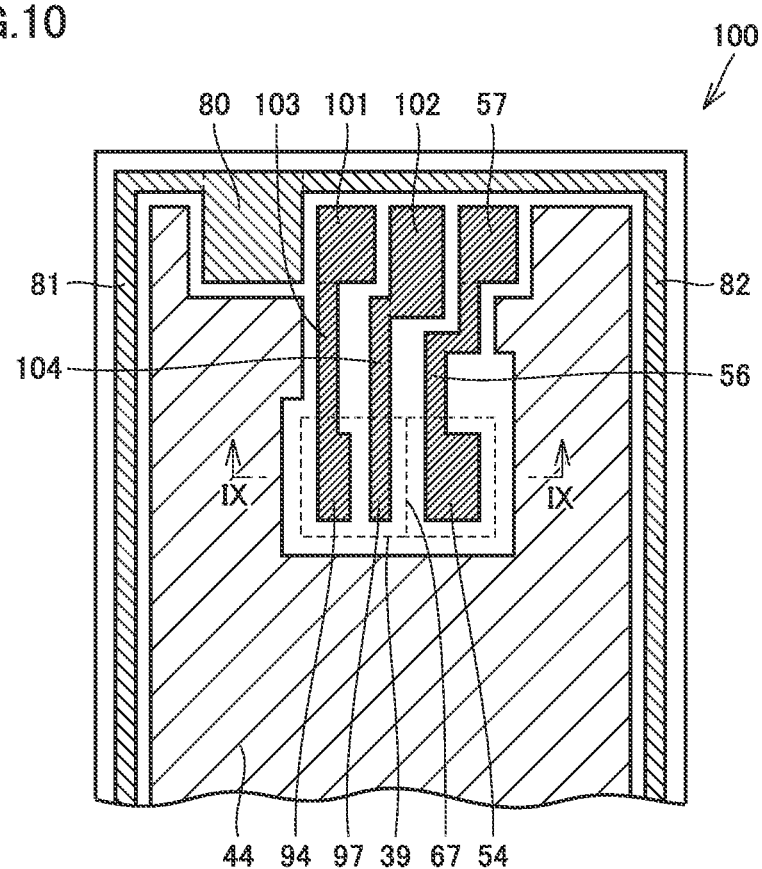
FIG. 10 is a schematic plan view showing the configuration of the insulated-gate transistor according to the third embodiment.

As shown in FIG. 10, as seen in the direction perpendicular to second main surface 2, isolation trench 39 has a rectangular shape, for example. Boundary trench 67 continues to isolation trench 39. Boundary trench 67 divides a region surrounded by isolation trench 39 in two parts. As seen in the direction perpendicular to second main surface 2, boundary trench 67 is linear, for example. Boundary trench 67 has one end and the other end, each of which continues to isolation trench 39.

Source pad 57 is located next to fourth pad 102. Fourth pad 102 is located between third pad 101 and source pad 57. Source wire region 56 is located next to fourth connection wire 104. Fourth connection wire 104 is located between third connection wire 103 and source wire region 56. Second source wire 54 is located next to fourth wire 97. Fourth wire 97 is located between third wire 94 and second source wire 54. MOSFET 100 according to the fourth embodiment also has the same functions and effect as those of MOSFET 100 according to the first embodiment.

Although n type has been described as the first conductivity type and p type has been described as the second conductivity type in each above-described embodiment, p type may be the first conductivity type and n type may be the second conductivity type. Although a MOSFET has been described as an example of insulated-gate transistor 100 in each above-described embodiment, insulated-gate transistor 100 may be an insulated gate bipolar transistor (IGBT), for example. In addition, the concentration of a p type impurity and the concentration of an n type impurity in each impurity region described above can be measured, for example, with a scanning capacitance microscope (SCM) or secondary ion mass spectrometry (SIMS). The position of a boundary surface between the p type region and n type region 6 (that is, a PN interface) can be identified, for example, with the SCM or SIMS. Further, although a current sensor or a temperature sensor has been described as being disposed in sense region 20 in the first to third embodiments, both the current sensor and the temperature sensor may be disposed in sense region 20 as illustrated in the fourth embodiment.

In each above-described embodiment, a semiconductor substrate made of a semiconductor different from silicon carbide may be used instead of silicon carbide substrate 9. Specifically, gallium nitride (GaN), gallium oxide ($Ga_2O_3$), aluminum nitride (AlN), silicon (Si) or aluminum gallium nitride (AlGaN), for example, can be used as the semiconductor.

It should be understood that the embodiments disclosed herein are illustrative and non-restrictive in every respect. The scope of the present invention is defined by the terms of the claims rather than the description above, and is intended to include any modifications within the meaning and scope equivalent to the terms of the claims.

REFERENCE SIGNS LIST 1 first main surface; 2 second main surface; 3 power supply; 4 ammeter; 5 third p type region; 6 n type region; 7 fifth contact region; 9 silicon carbide substrate; 10 active region; 11 first substrate portion; 12 first impurity region (first drift region); 13 second impurity region (first body region); 14 third impurity region (first source region); 15 first contact region; 16 first p type region; 17 first side surface; 18 first bottom surface; 19 first gate trench; 20 sense region; 21 second substrate portion; 22 fourth impurity region (second drift region); 23 fifth impurity region (second body region); 24 sixth impurity region (second source region); 25 second contact region; 26 second p type region; 27 second side surface; 28 second bottom surface; 29 second gate trench; 30 isolation region; 31 third substrate portion; 32 third drift region; 33 fourth substrate portion; 34 fourth drift region; 37 third side surface; 38 third bottom surface; 39 isolation trench; 41 first insulating film; 42 first conductor (first gate electrode); 43 first contact electrode; 44 first source wire; 45 first source electrode (source electrode, first electrode); 51 third insulating film; 52 third conductor (second gate electrode); 53 second contact electrode; 54 second source wire; 55 second source electrode; 56 source wire region; 57 source pad; 61 second insulating film; 62 second conductor; 70 drain electrode (second electrode); 71 first interlayer insulating film; 72 second interlayer insulating film; 73 passivation layer; 74 first insulating layer; 75 second insulating layer; 76 third interlayer insulating film; 80 gate pad; 81 first gate runner; 82 second gate runner; 83 gate connection wire; 84 current sensor element; 85 temperature sensor element; 91 sixth impurity region (third contact region); 92 fourth contact region; 93 third contact electrode; 94 third wire; 95 fourth conductor (third electrode); 96 fourth contact electrode; 97 fourth wire; 98 fourth electrode; 100 insulated-gate transistor (MOSFET); 101 third pad; 102 fourth pad; 103 third connection wire; 104 fourth connection wire; D drain terminal; G1 first gate terminal; G2 second gate terminal; S1 first source terminal; S2 second source terminal.

The invention claimed is:

1. An insulated-gate transistor comprising:
an active region;
a sense region spaced from the active region;
an isolation trench surrounding the sense region and isolating the sense region from the active region,
the active region including a first impurity region having a first conductivity type, a second impurity region provided on the first impurity region and having a second conductivity type different from the first conductivity type, and a third impurity region provided on the second impurity region so as to be separated from the first impurity region and having the first conductivity type,
the active region being provided with a first gate trench defined by a first side surface and a first bottom surface continuing to the first side surface,
the first side surface being formed by the first impurity region, the second impurity region and the third impurity region,
the first bottom surface being formed by the first impurity region;
a first insulating film in contact with both the first side surface and the first bottom surface;
a first conductor provided on the first insulating film;
a second insulating film provided in the isolation trench; and
a second conductor provided on the second insulating film, wherein the isolation trench reaching the first impurity region,
the first insulating film being made of a material identical to that of the second insulating film,
the first conductor being made of a material identical to that of the second conductor and being electrically isolated from the second conductor,
the sense region includes a current sensor element and a temperature sensor element, and
the sense region is provided with a boundary trench isolating the current sensor element from the temperature sensor element and continuing to the isolation trench.

2. The insulated-gate transistor according to claim 1, wherein
the current sensor element includes a fourth impurity region having the first conductivity type and electrically connected to the first impurity region, a fifth impurity region having the second conductivity type and provided on the fourth impurity region, and a sixth impurity region provided on the fifth impurity region so as to be separated from the fourth impurity region and having the first conductivity type,
the sense region is provided with a second gate trench defined by a second side surface and a second bottom surface continuing to the second side surface,
the second side surface is formed by the fourth impurity region, the fifth impurity region and the sixth impurity region,
the second bottom surface is formed by the fourth impurity region,
the insulated-gate transistor further comprises
a third insulating film in contact with both the second side surface and the second bottom surface, and
a third conductor provided on the third insulating film, and
the first conductor is electrically connected to the third conductor.

3. The insulated-gate transistor according to claim 1, wherein
the temperature sensor element includes a fourth impurity region having the first conductivity type and electrically connected to the first impurity region, a fifth impurity region having the second conductivity type and provided on the fourth impurity region, and a sixth impurity region having the second conductivity type and being higher in impurity concentration than the fifth impurity region, the insulated-gate transistor further comprises
- a source electrode electrically connected to the third impurity region, and
- a fourth conductor electrically connected to each of the fifth impurity region and the sixth impurity region, and the source electrode is electrically isolated from the fourth conductor.

4. The insulated-gate transistor according to claim 1, wherein a depth of the isolation trench is equal to or greater than a depth of the first gate trench.

5. The insulated-gate transistor according to claim 4, wherein the depth of the isolation trench is equal to the depth of the first gate trench.

6. The insulated-gate transistor according to claim 1, wherein
- a width of the isolation trench in a cross section perpendicular to a direction in which the isolation trench extends is equal to or greater than a width of the first gate trench in a cross section perpendicular to a direction in which the first gate trench extends.

7. The insulated-gate transistor according to claim 1, wherein
- the first conductor and the second conductor are made of polysilicon.

* * * * *

UNITED STATES PATENT AND TRADEMARK OFFICE
CERTIFICATE OF CORRECTION

PATENT NO. : 11,227,947 B2
APPLICATION NO. : 16/764006
DATED : January 18, 2022
INVENTOR(S) : Toru Hiyoshi It is certified that error appears in the above-identified patent and that said Letters Patent is hereby corrected as shown below:

In the Claims

Replace Column 17, Line 62-Column 19, Line 28, (approx.) with attached Claims:

--1. An insulated-gate transistor comprising:
   an active region;
   a sense region spaced from the active region;
   an isolation trench surrounding the sense region and isolating the sense region from the active region,
      the active region including a first impurity region having a first conductivity type, a second impurity region provided on the first impurity region and having a second conductivity type different from the first conductivity type, and a third impurity region provided on the second impurity region so as to be separated from the first impurity region and having the first conductivity type,
      the active region being provided with a first gate trench defined by a first side surface and a first bottom surface continuing to the first side surface,
      the first side surface being formed by the first impurity region, the second impurity region and the third impurity region,
      the first bottom surface being formed by the first impurity region;
   a first insulating film in contact with both the first side surface and the first bottom surface;
   a first conductor provided on the first insulating film;
   a second insulating film provided in the isolation trench; and
   a second conductor provided on the second insulating film, wherein
   the isolation trench reaching the first impurity region,
   the first insulating film being made of a material identical to that of the second insulating film,
   the first conductor being made of a material identical to that of the second conductor and being electrically isolated from the second conductor,
   the sense region includes a current sensor element and a temperature sensor element, and
   the sense region is provided with a boundary trench isolating the current sensor element from the temperature sensor element and continuing to the isolation trench.

Signed and Sealed this
Sixteenth Day of August, 2022

Katherine Kelly Vidal
*Director of the United States Patent and Trademark Office*

2. The insulated-gate transistor according to claim 1, wherein
the current sensor element includes a fourth impurity region having the first conductivity type and electrically connected to the first impurity region, a fifth impurity region having the second conductivity type and provided on the fourth impurity region, and a sixth impurity region provided on the fifth impurity region so as to be separated from the fourth impurity region and having the first conductivity type,
the sense region is provided with a second gate trench defined by a second side surface and a second bottom surface continuing to the second side surface,
the second side surface is formed by the fourth impurity region, the fifth impurity region and the sixth impurity region,
the second bottom surface is formed by the fourth impurity region,
the insulated-gate transistor further comprises
a third insulating film in contact with both the second side surface and the second bottom surface, and
a third conductor provided on the third insulating film, and
the first conductor is electrically connected to the third conductor.

3. The insulated-gate transistor according to claim 1, wherein
the temperature sensor element includes a fourth impurity region having the first conductivity type and electrically connected to the first impurity region, a fifth impurity region having the second conductivity type and provided on the fourth impurity region, and a sixth impurity region having the second conductivity type and being higher in impurity concentration than the fifth impurity region,
the insulated-gate transistor further comprises
a source electrode electrically connected to the third impurity region, and
a fourth conductor electrically connected to each of the fifth impurity region and the sixth impurity region, and
the source electrode is electrically isolated from the fourth conductor.

4. The insulated-gate transistor according to claim 1, wherein
a depth of the isolation trench is equal to or greater than a depth of the first gate trench.

5. The insulated-gate transistor according to claim 4, wherein
the depth of the isolation trench is equal to the depth of the first gate trench.

6. The insulated-gate transistor according to claim 1, wherein
a width of the isolation trench in a cross section perpendicular to a direction in which the isolation trench extends is equal to or greater than a width of the first gate trench in a cross section perpendicular to a direction in which the first gate trench extends.

7. The insulated-gate transistor according to claim 1, wherein
the first conductor and the second conductor are made of polysilicon.--